US012796464B2

(12) United States Patent
Pan et al.

(10) Patent No.: US 12,796,464 B2
(45) Date of Patent: Nov. 10, 2026

(54) THERMAL INTERFACE MATERIAL INCLUDING A MULTI-LAYER STRUCTURE AND METHODS OF FORMING THE SAME

(71) Applicant: Taiwan Semiconductor Manufacturing Company Limited, Hsinchu (TW)

(72) Inventors: Chih-Chien Pan, Taipei City (TW); Li-Hui Cheng, New Taipei City (TW); Pu Wang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 630 days.

(21) Appl. No.: 18/311,907

(22) Filed: May 4, 2023

(65) Prior Publication Data

US 2024/0371722 A1 Nov. 7, 2024

(51) Int. Cl.

*H10W 40/25* (2026.01)
*F28F 21/02* (2006.01)

(Continued)

(52) U.S. Cl.

CPC ........... *H10W 40/255* (2026.01); *F28F 21/02* (2013.01); *H10W 90/00* (2026.01); *F28F 2255/06* (2013.01); *H10B 80/00* (2023.02); *H10W 72/01351* (2026.01); *H10W 72/324* (2026.01); *H10W 72/325* (2026.01); *H10W 72/353* (2026.01); *H10W 72/354* (2026.01); *H10W 90/736* (2026.01)

(58) Field of Classification Search

None

See application file for complete search history.

(56) References Cited

U.S. PATENT DOCUMENTS

2019/0036186 A1* 1/2019 Kim .................... H01M 4/8867
2019/0323785 A1* 10/2019 Eid ......................... F28F 3/022
2020/0404809 A1* 12/2020 Cola .................. H05K 7/20481

FOREIGN PATENT DOCUMENTS

CN 107446555 A 12/2017

OTHER PUBLICATIONS

Machine Translation of CN 107446555 (Year: 2017).*
Jianq Chyun Intellectual Property Office; TW Application No. 112124438, Office Action mailed Feb. 20, 2024; 12 pages.

* cited by examiner

*Primary Examiner* — Anthony Ho
(74) *Attorney, Agent, or Firm* — The Marbury Law Group, PLLC

(57) ABSTRACT

An embodiment thermal interface material may include a first component including a first thermal conductivity that is between 20 W/cm·K and 30 W/cm·K and a second component including a second thermal conductivity that is between 30 W/cm·K and 40 W/cm·K. Each of the first component and the second component may include a thermally conductive material including one or more of graphite, graphene, carbon nanotubes, a metal, and a phase change material. For example, each of the first component and the second component include graphite dispersed within a polymer matrix that may include one or more of a hydrogenated hydrocarbon resin, polybutene, polyisobutylene, and an acrylic acid ester copolymer. According to an embodiment, the first component may include 40 wt % to 60 wt % graphite and the second component may include 60 wt % to 70 wt % graphite.

20 Claims, 8 Drawing Sheets

(51) Int. Cl.

| | |
|---|---|
| ***H10W 90/00*** | (2026.01) |
| *H10B 80/00* | (2023.01) |
| *H10W 72/00* | (2026.01) |
| *H10W 72/30* | (2026.01) |

100

700

THERMAL INTERFACE MATERIAL INCLUDING A MULTI-LAYER STRUCTURE AND METHODS OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers over a semiconductor substrate, and patterning the various material layers using lithography and etching to form circuit components and elements thereon. Dozens or hundreds of integrated circuits are typically manufactured on a single semiconductor wafer, and individual dies on the wafer are singulated by sawing between the integrated circuits along scribe lines. The individual dies are typically packaged separately, in multi-chip modules, or in other types of packaging, for example. Issues related to thermal management and heat removal from semiconductor packages present challenges requiring new structures and techniques for efficient thermal energy management.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
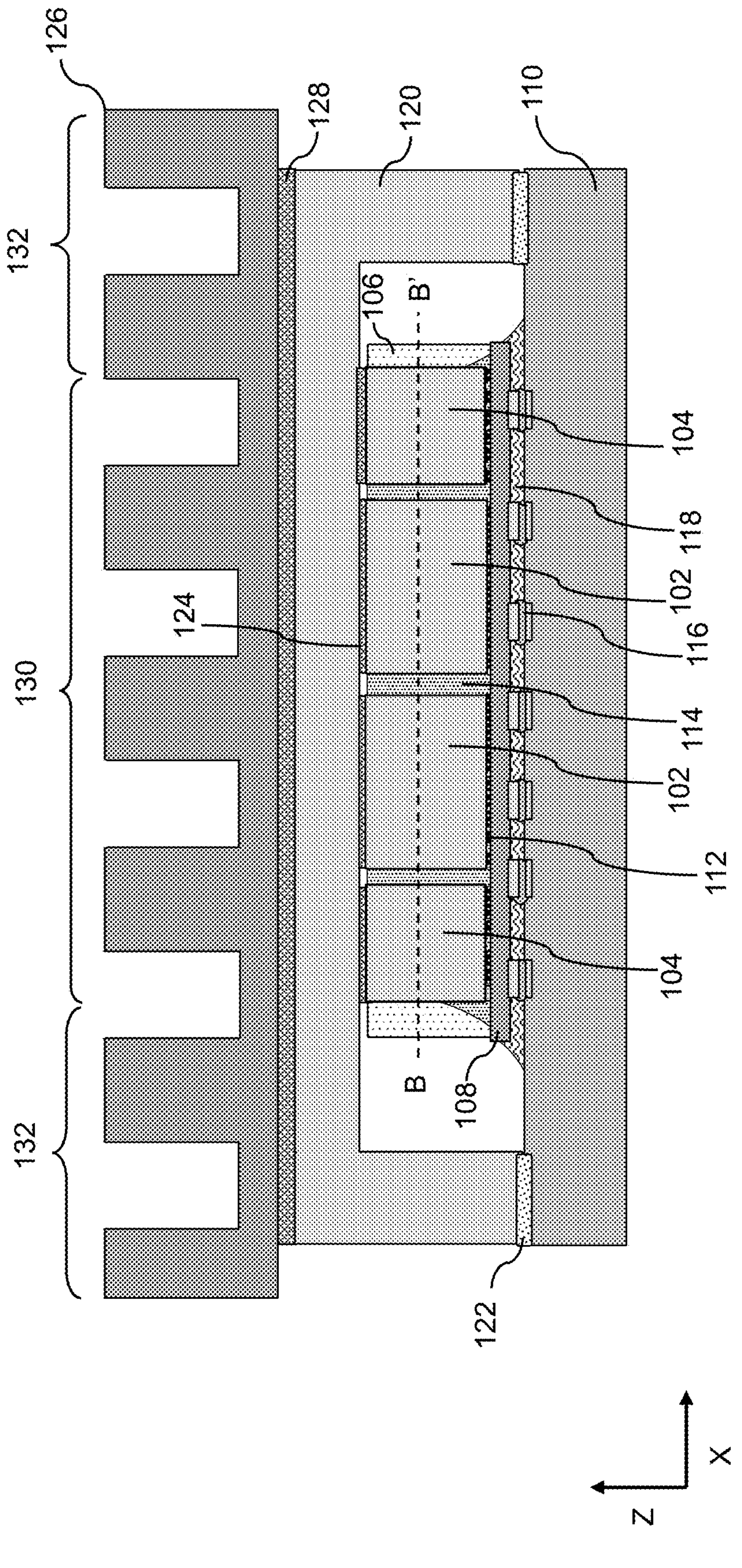
FIG. 1A is a vertical cross-sectional view of a semiconductor device along line AA' in FIG. 1B, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The semiconductor package typically includes a housing that encloses the IC dies to protect the IC dies from damage. The housing may also provide heat dissipation from the semiconductor package. In some cases, the semiconductor package may include a package lid that may include a thermally-conductive material (e.g., a metal or metal alloy, such as copper). The package lid may be located over the IC dies. Heat generated by the IC dies may be transferred from the upper surfaces of the IC dies into the package lid and may be ultimately dissipated to the environment. The heat may optionally be dissipated through a heat sink that may be attached to or may be integrally formed with the lid or through other components of the semiconductor package. Package lids made of a single metal (e.g., copper), however, may not be configured to efficiently remove heat in situations in which the heat sources generate a non-uniform spatial distribution of heat flux. In such situations, hot spots may be generated that may cause damage to semiconductor devices.

An embodiment thermal interface material may provide advantages in that complementary properties of thermal conductivity and adhesive characteristics may be optimized by an appropriate chose of relative proportions and sizes of a first component and a second component. In this regard, the second component may have a higher thermal conductivity and may have lower surface roughness while the first component may have higher surface roughness but may have better adhesive properties. The lower surface roughness of the second component may improve heat transfer between semiconductor dies and a package lid while the adhesive properties of the first component may allow the thermal interface material to be adhered to one or more of the semiconductor dies and the package lid without the use of additional adhesives, in some embodiments. As such, the embodiment thermal interface material, which may have a multi-layer structure, may have advantages over thermal interface materials having only a single component.

An embodiment thermal interface material may include a first component having a first thermal conductivity that is between 20 W/cm·K and 30 W/cm·K and a second component having a second thermal conductivity that is between 30 W/cm·K and 40 W/cm·K. Each of the first component and the second component may include a thermally conductive material including one or more of graphite, graphene, carbon nanotubes, a metal, and a phase change material. For example, each of the first component and the second component may include graphite dispersed within a polymer matrix that may include one or more of a hydrogenated hydrocarbon resin, polybutene, polyisobutylene, and an acrylic acid ester copolymer. According to an embodiment, the first component may include 40 wt % to 60 wt % graphite and the second component may include 60 wt % to 70 wt % graphite.

A further embodiment thermal interface material may include a planar shape extending along a width direction, a length direction, and a thickness direction, and a multi-layer structure including alternating layers of a first component and a second component stacked along the width direction such that interfaces between adjacent layers are perpendicular to the width direction and extend in the length direction and the thickness direction. Each of the first component and the second component may include a thermally conductive material including one or more of graphite, graphene, carbon nanotubes, a metal, and a phase change material. For example, the first component may include 40 wt % to 60 wt % of graphite dispersed in a first polymer matrix and the second component may include 60 wt % to 70 wt % of graphite dispersed in a second polymer matrix. One or both of the first polymer matrix and the second polymer matrix may include one or more of a hydrogenated hydrocarbon resin, polybutene, polyisobutylene, and an acrylic acid ester copolymer.

An embodiment method of manufacturing a thermal interface material may include forming a stack of alternating layers of a first component and a second component stacked along a first direction such that interfaces between adjacent alternating layers are perpendicular to the first direction and extend along a second direction and a third direction. The first component may include a first thermal conductivity that is between 20 W/cm·K and 30 W/cm·K, and the second component may include a second thermal conductivity that is between 30 W/cm·K and 40 W/cm·K. The method may further include performing a compression operation to compress the stack of alternating layers so that adjacent layers adhere to one another to form a bulk thermal interface material, and slicing the bulk thermal interface material along planes perpendicular to the first direction, the second direction, and the third direction to generate a planar shape extending along a width direction, a thickness direction, and a length direction, such that the width direction corresponds to the first direction, the thickness direction corresponds to the second direction, and the length direction corresponds to the third direction.

Figure 1B:
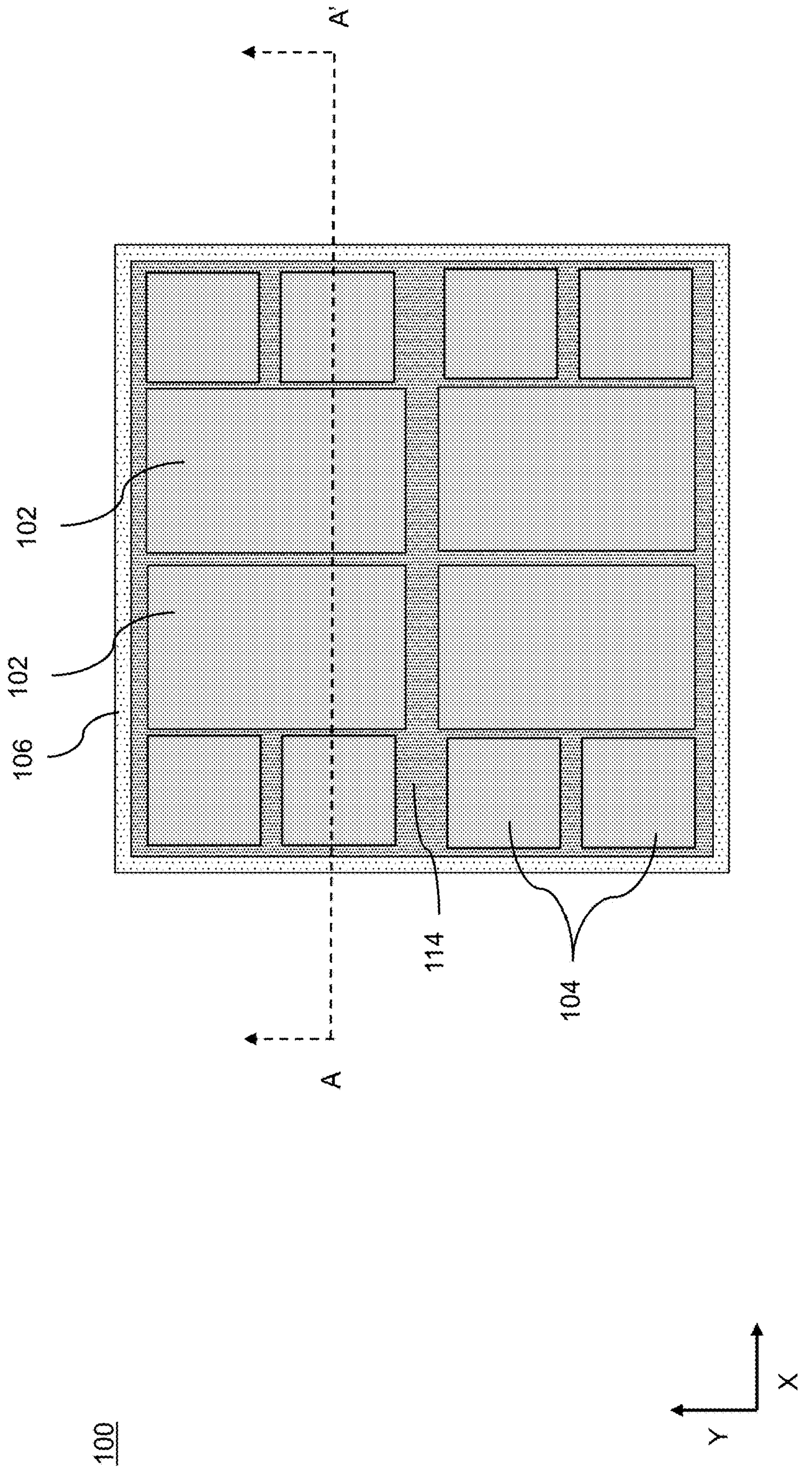
FIG. 1B is a horizontal cross-sectional view of the semiconductor device along line BB' in FIG. 1A, according to various embodiments.

FIG. 1A is a vertical cross-sectional view of a semiconductor package structure 100, according to various embodiments. FIG. 1B is a horizontal cross-sectional view of the semiconductor package structure 100 defined by a horizontal plane indicated by the line B-B' in FIG. 1A. The view of FIG. 1A is defined by a vertical plane indicated by the line A-A' in FIG. 1B. The semiconductor package structure 100 may include one or more integrated circuit (IC) semiconductor devices. For example, the semiconductor package structure 100 may include a plurality of first semiconductor dies 102 and a plurality of second semiconductor dies 104. In various embodiments, each first semiconductor die 102 may be configured as a three-dimensional device, such as a three-dimensional integrated circuit (3DIC), a system-on-chip (SoC) device, or a system-on-integrated-circuit (SoIC) device.

Each of the first semiconductor dies 102 may be formed by placing chips on a semiconductor wafer level. These three-dimensional devices may provide improved integration density and other advantages, such as faster speeds and higher bandwidths, due to a decreased length of interconnects between the stacked chips. In some embodiments, one of the first semiconductor dies 102 may also be referred to as a "first die stack." In some embodiments, each of the first semiconductor dies 102 may be dies or chips, such as logic dies, power management dies, voltage regulator dies, etc.

In the semiconductor package structure 100 of FIGS. 1A and 1B, the plurality of first semiconductor dies 102 includes four first die stacks (e.g., see FIG. 1B), each of which may be configured as a SoC device. In various embodiments, the first semiconductor dies 102 may be adjacent to one another and may be located in a central portion of the semiconductor package structure 100. The semiconductor package structure 100 may further include one or more second semiconductor dies 104. In some embodiments, the one or more second semiconductor dies 104 may be three-dimensional IC semiconductor devices and may also be referred to as "second die stacks." In some embodiments, the second semiconductor dies 104 may each be a semiconductor memory device, such as a high bandwidth memory (HBM) device.

In the embodiment shown in FIGS. 1A and 1B, the plurality of second semiconductor dies 104 includes eight second die stacks (e.g., see FIG. 1B), each of which may be an HBM device. The second semiconductor dies 104 may be located on a periphery around the first semiconductor dies 102, as shown in FIG. 1B. A molding material 106, which may include an epoxy-based material, may be located around the periphery of the first semiconductor dies 102 and the second semiconductor dies 104. Although the embodiment illustrated in FIGS. 1A and 1B includes four (4) first semiconductor dies 102 and eight (8) second semiconductor dies 104, greater or fewer die stacks may be included in semiconductor package structures in other embodiments.

Referring again to FIG. 1A, the first semiconductor dies 102 and the second semiconductor dies 104 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer are contemplated within the scope of the disclosure. The interposer 108 may include a plurality of conductive bonding pads (not shown) on upper and lower surfaces of the interposer 108 and a plurality of conductive interconnects (not shown) extending through the interposer 108 between the upper and lower bonding pads of the interposer 108.

The conductive interconnects may distribute and route electrical signals between IC semiconductor devices (e.g., first semiconductor dies 102 and second semiconductor dies 104) and a package substrate 110. Thus, the interposer 108 may also be referred to as redistribution layers (RDLs). A plurality of first metal bumps 112, such as micro-bumps, may electrically connect conductive bonding pads on the bottom surfaces of the first semiconductor dies 102 and second semiconductor dies 104 to the conductive bonding pads on the upper surface of the interposer 108.

In one non-limiting embodiment, first metal bumps 112 in the form of micro-bumps may include a plurality of first metal stacks, such as a plurality of Cu—Ni—Cu stacks, located on the bottom surfaces of the first semiconductor dies 102 and the second semiconductor dies 104. A corresponding plurality of second metal stacks (e.g., Cu—Ni—Cu stacks) may be located on the upper surface of the interposer 108. A solder material, such as tin (Sn), may be located between respective first and second metal stacks to electrically connect the first semiconductor dies 102 and the second semiconductor dies 104 to the interposer 108. Other suitable materials for the first metal bumps 112 are within the contemplated scope of this disclosure.

A first underfill material portion 114 may be provided in the spaces surrounding the first metal bumps 112 and between the bottom surfaces of the first semiconductor dies 102, the second semiconductor dies 104, and the upper surface of the interposer 108. The first underfill material portion 114 may also be provided in the spaces laterally separating adjacent die stacks (i.e., first semiconductor dies 102 and second semiconductor dies 104) of the semiconductor package structure 100. Thus, the first underfill material portion 114 may extend over side surfaces of the first semiconductor dies 102 and/or the second semiconductor dies 104, as shown in FIG. 1A. In various embodiments, the first underfill material portion 114 may include an epoxy-based material, which may include a composite of resin and filler materials. Other underfill materials are within the contemplated scope of this disclosure.

The interposer 108 may be located on a package substrate 110, which may provide mechanical support for the interposer 108 and the IC semiconductor devices (e.g., first semiconductor dies 102 and second semiconductor dies 104) that are mounted thereon. The package substrate 110 may include a suitable material, such as a semiconductor material (e.g., a semiconductor wafer, such as a silicon wafer), a ceramic material, an organic material (e.g., a polymer and/or thermoplastic material), a glass material, combinations thereof, etc. Other suitable substrate materials are within the contemplated scope of this disclosure.

In various embodiments, the package substrate 110 may include a plurality of conductive bonding pads in an upper surface of the package substrate 110. A plurality of second metal bumps 116, such as C4 solder bumps, may electrically connect conductive bonding pads on the bottom surface of the interposer 108 to the conductive bonding pads on the upper surface of the package substrate 110. In various embodiments, the second metal bumps 116 may include a suitable solder material, such as tin (Sn).

A second underfill material portion 118 may be provided in the spaces surrounding the second metal bumps 116 and between the bottom surface of the interposer 108 and the upper surface of the package substrate 110. In various embodiments, the second underfill material portion 118 may include an epoxy-based material, which may include a composite of resin and filler materials. The second underfill material portion 118 may be the same material as the first underfill material portion 114 or may be a different material.

A package lid 120 may be disposed over the upper surfaces of the IC semiconductor devices (e.g., the first semiconductor dies 102 and the second semiconductor dies 104). The package lid 120 may also laterally surround the IC semiconductor devices (e.g., the first semiconductor dies 102 and the second semiconductor dies 104) such that the first semiconductor dies 102 and the second semiconductor dies 104 are fully-enclosed by the combination of the package substrate 110 and the package lid 120. In other embodiments, the package lid 120 may only partially enclose the first semiconductor dies 102 and the second semiconductor dies 104. For example, the package lid 120 may have one or more vent holes (not shown) to allow moisture and vapors to escape the package lid 120.

The package lid 120 may be attached to an upper surface of the package substrate 110 with an adhesive 122. In various embodiments, the adhesive 122 may be a thermally-conductive adhesive. Other suitable adhesive materials are within the contemplated scope of this disclosure. In some embodiments, the package lid 120 may be integrally formed or may include pieces. For example, the package lid 120 may include a ring portion (not shown) surrounding the first semiconductor dies 102 and the second semiconductor dies 104, a cover portion covering the ring portion, the first semiconductor dies 102, and the second semiconductor dies 104, and an adhesive (not shown) connecting the cover portion to the ring portion.

In some embodiments, a first thermal interface material 124 may be disposed between an upper surface of each of the IC semiconductor devices (e.g., the first semiconductor dies 102 and the second semiconductor dies 104) and an interior surface of the package lid 120. In various embodiments, the first thermal interface material 124 may include a solid or gel-type thermal interface material having a relatively high thermal conductivity. Other suitable materials for the first thermal interface material 124 are within the contemplated scope of this disclosure. In some embodiments, the first thermal interface material 124 may include a single thermal interface material piece covering both the first semiconductor dies 102 and the second semiconductor dies 104, or two or more thermal interface material pieces corresponding to each of the first semiconductor dies 102 and the second semiconductor dies 104.

In some embodiments, a heat sink 126 may be provided on an upper surface of the package lid 120. The heat sink 126 may include fins or other features that may be configured to increase a surface area between the heat sink 126 and a cooling fluid, such as ambient air. In some embodiments, the heat sink 126 may be a separate component that may be attached to an upper surface of the package lid 120, as shown in FIG. 1A. Alternatively, the heat sink 126 may be integrally formed with the package lid 120. In embodiments in which the heat sink 126 is a separate component from the package lid 120, a second thermal interface material 128 may be located between the upper surface of the package lid 120 and a bottom surface of the heat sink 126. In various embodiments, the second thermal interface material 128 may include a solid or gel-type thermal interface material having a relatively high thermal conductivity. Other suitable materials for the second thermal interface material 128 are within the contemplated scope of this disclosure. The heat sink 126 may include a suitable thermally-conductive material, such as a metal (e.g., copper) or metal alloy.

In various embodiments, a central region 130 of the semiconductor package structure 100 may be a region of the semiconductor package structure 100 that includes a relatively higher density of the one or more integrated circuit (IC) semiconductor devices, such as the first semiconductor dies 102 and the second semiconductor dies 104, as shown in FIGS. 1A and 1B. The semiconductor package structure 100 may include peripheral regions 132. Each of the peripheral regions 132 may be a region of the semiconductor package structure 100 that has a relatively lower density of integrated circuit (IC) semiconductor devices, for example, including a region that does not include any IC semiconductor devices.

In the embodiment of FIGS. 1A and 1B, excessive heat accumulation in the semiconductor package structure 100 may be more likely to occur in the central region 130 of the semiconductor package structure 100 that includes the highest density of IC semiconductor devices (e.g., the first semiconductor dies 102 and the second semiconductor dies 104) than in the peripheral regions 132 of the semiconductor package structure 100. This may be because the majority of the heat in the semiconductor package structure 100 is generated by the IC semiconductor devices (e.g., the first semiconductor dies 102 and the second semiconductor dies 104) in the central region 130 of the semiconductor package structure 100. As such, heat transfer through the package lid 120 may occur primarily along the vertical direction (i.e., the direction of the z-axis in FIG. 1A) rather than spreading horizontally through the semiconductor package structure 100 (i.e., along the x-axis and y-axis directions in FIGS. 1A and 1B). Thus, the portion of the package lid 120 overlying the semiconductor dies (102, 104) in the central region 130 of the semiconductor package structure 100 may be the hottest portion of the package lid 120 during operation of the semiconductor device.

The concentration of heat generating elements and the hottest portion of the package lid 120 being located in the central region 130 may result in overheating and damage to the semiconductor package structure 100 if the rate of heat loss from the central region 130 of the semiconductor package structure 100 is not sufficiently high. In practice, this means that the package lid 120 may include a material having a very high thermal conductivity, such as copper, which has a thermal conductivity of about 398 W/m·K. As development of semiconductor package structures progresses, however, the heat generated by increasingly more densely packaged IC components may demand new structures and methods for more efficient heat removal.

Figure 2:
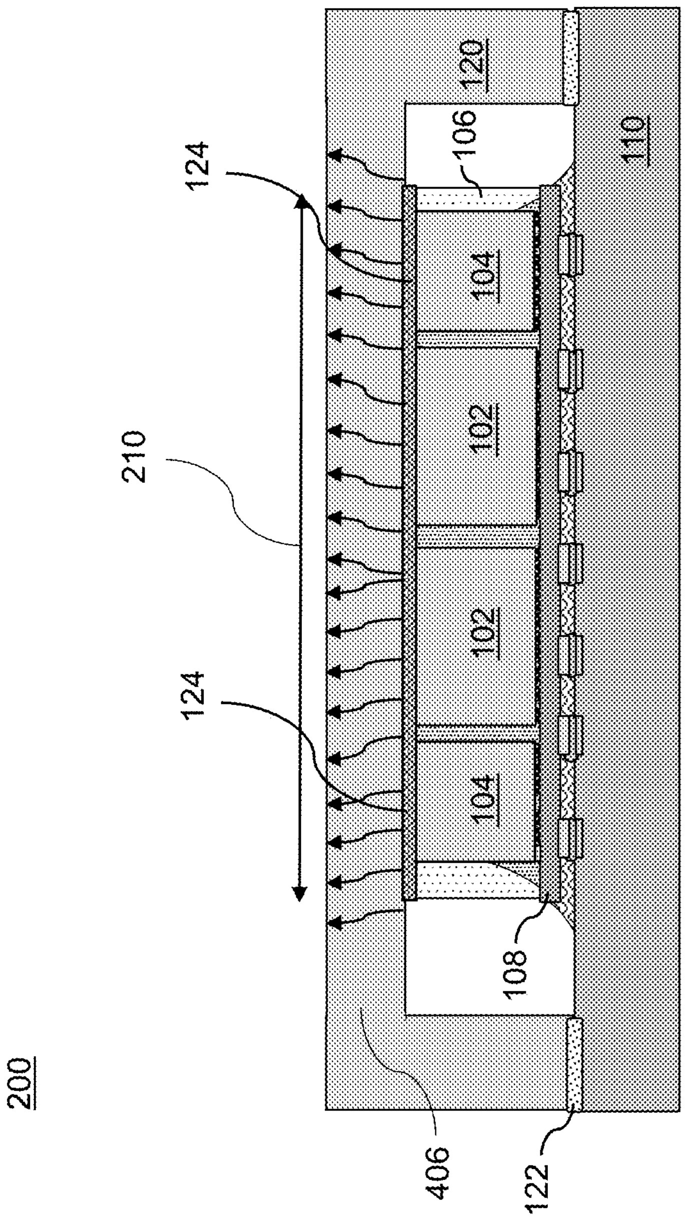
FIG. 2 is a vertical cross-sectional view of an embodiment semiconductor package having a uniform distribution of heat flux, according to various embodiments.

FIG. 2 is a vertical cross-sectional view of a semiconductor package structure 200 having a uniform distribution of heat flux, according to various embodiments. In this regard, the embodiment semiconductor package structure 200 shown in FIG. 2 may include a solid thermal interface material 124 that includes a multi-layer structure 204 (e.g., see the multi-material structure of FIG. 5) including a first component 206 having a first thermal conductivity and a second component 208 having a second thermal conductivity, as described in greater detail, below. The presence of the thermal interface material 124 may generate a uniform distribution of heat flux.

The first component 206 may be a first composite material that may have a first surface roughness that is between 40 microns and 50 microns, and the second component 208 may be a second composite material that may have a second component having a second surface roughness that is between 3 microns and 4 microns. For example, each of the first component 206 and the second component 208 may include a thermally conductive material dispersed within a polymer matrix. In various embodiments, the thermally conductive material may be one or more of graphite, graphene, carbon nanotubes, a metal, and a phase change material, and the polymer matrix may include one or more of hydrogenated hydrocarbon resin, polybutene, polyisobutylene, and an acrylic acid ester copolymer. Various other conductive materials and polymer matrix materials are within the contemplated scope of the disclosed embodiments. In certain example embodiments, the first component 206 may be a first composite material including graphite dispersed in a polymer matrix material such that the graphite has a weight fraction in a range from approximately 40 wt % to approximately 60 wt %. Similarly, the second component 208 may include a second composite material including graphite dispersed in a polymer matrix material such that the graphite has a weight fraction in a range from approximately 60 wt % to approximately 70 wt %.

The first component 206 and the second component 208 may have complementary properties. For example, the second component 208 may have a higher thermal conductivity (e.g., between 30 W/cm·K and 40 W/cm·K) and may have lower surface roughness (between 3 microns and 4 microns), while the first component 206 may have higher surface roughness (between 40 microns and 50 microns) but may have better adhesive properties. The lower surface roughness of the second component 208 may improve heat transfer between the semiconductor dies (102, 104) and the package lid 120, while the adhesive properties of the first component 206 may allow the thermal interface material 124 to be adhered to one or more of the semiconductor dies (102, 104) and the package lid 120 without the use of additional adhesives. As such, desirable properties of the resulting multi-layer structure 204 may be optimized by an appropriate choice of relative proportions and sizes of the first component 206 and the second component 208, as described in greater detail, below.

In general, performance of the thermal interface material 124 increases with increasing thermal conductivity. For example, a thermal conductivity greater than 20 W/cm K may represent an improvement over existing thermal interface materials. As described above, the thermal conductivity of the composite material may be increased by increasing a weight fraction of graphite. However, the weight fraction of graphite cannot be increased indefinitely because other properties of the material (e.g., adhesive properties, surface roughness) may change in undesirable ways. Through experimentation, the above-quoted ranges (first surface roughness that is between 40 microns and 50 microns, second surface roughness that is between 3 microns and 4 microns, first thermal conductivity that is between 20 W/cm·K and 30 W/cm·K, and second thermal conductivity that is between 30 W/cm·K and 40 W/cm·K) may represent a reasonable tradeoff between complementary properties (thermal conductivity, surface roughness, adhesion) although further optimization may performed through additional variation of relative weight fractions of graphite in the first component 206 and the second component 208.

The solid thermal interface material 124 may have a width 210 that is vertically overlapping (e.g., when seen in a plan view) with a location of one or more of the first semiconductor dies 102 and the second semiconductor dies 104, as shown in FIG. 2. The width 210 may be configured to optimize a heat flow pattern based on an estimated or measured heat flux that may be generated by the first semiconductor dies 102 and the second semiconductor dies 104. For example, the multi-layer structure 204 may have a width 210 that overlaps with all of the first semiconductor dies 102 and the second semiconductor dies 104, as shown in FIG. 2. In other embodiments, the width 210 may be chosen to be smaller so as to only overlap with the first semiconductor dies 102. In this way, the width 210 may be chosen to cover an area corresponding to hot spots.

The spatial location, shape, and width of the solid thermal interface material 124 may be configured in various ways, as described in greater detail with reference to FIGS. 5 to 6D, below. In this way, the package lid 120 may be configured to effectively have a top portion 406 having a spatially varying thermal conductivity that is greater in a first region (e.g., corresponding to a location of the solid thermal interface material 124) than in a second region (e.g., corresponding to a location of a region in which the solid thermal interface material 124 is absent). Further, depending on the overall thermal characteristics of the semiconductor package structure 200, at least a portion of the first region (i.e., the solid thermal interface material 124) may be positioned to be overlapping with a location of at least one semiconductor die (102, 104) in a plan view.

In addition to dissipating heat, the package lid 120 may also be configured to have advantageous structural properties. In this regard, the package lid 120 may provide structural stability to the semiconductor package structure 200. For example, during thermal cycling, the package lid 120 may be configured to reduce or mitigate structural deformations including warping, cracking, interface delamination, etc., that may otherwise be caused due different coefficients of thermal expansion of the various materials of the semiconductor package structure 200. For example, the package substrate 110 may have a coefficient of thermal expansion (CTE) of approximately 14.5 ppm/° C. whereas copper (as used in a package lid such as 120_a_) has a coefficient of thermal expansion that is approximately 17 ppm/° C. The discrepancy between the coefficient of thermal expansion of the package substrate 110 and, for example, a copper package lid 120_a_ may lead to significant warpage of the semiconductor package structure 200. The solid thermal interface material 124 may provide improved heat transfer between the semiconductor dies (102, 104) and the package lid 120 which may act to provide a more uniform heat distribution such that hot spots may be avoided. As such, the improved thermal heat transfer may help to mitigate thermally-induced structural deformations.

Figure 3C:
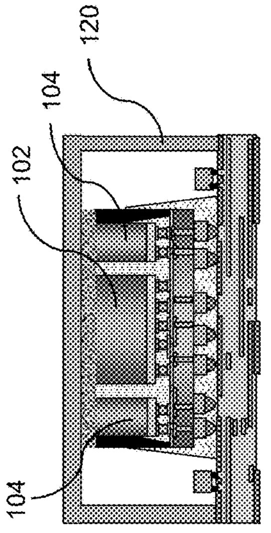
FIG. 3C is a vertical cross-sectional view of a semiconductor package structure having a solid thermal interface material adhered to a top surface of the semiconductor package structure and a package lid covering the semiconductor package structure.
Figure 3B:
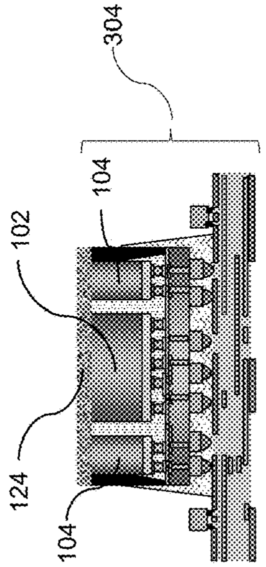
FIG. 3B is a vertical cross-sectional view of a semiconductor package structure having a solid thermal interface material adhered to a top surface of the semiconductor package structure.
Figure 3A:
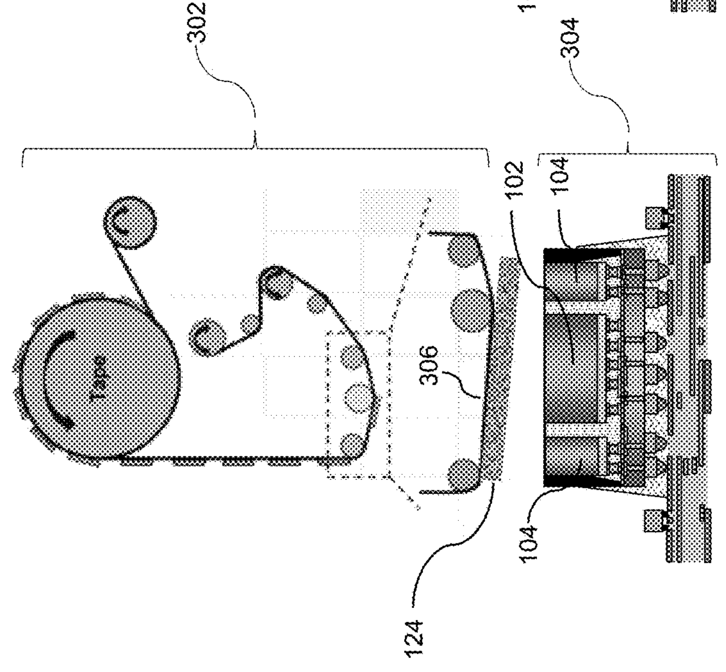
FIG. 3A is a vertical cross-sectional view of an apparatus that may be used to adhere a solid thermal interface material to a surface of a semiconductor package structure.

FIG. 3A is a vertical cross-sectional view of an apparatus 302 that may be used to adhere a solid thermal interface material 124 (e.g., see FIGS. 2 and 5) to a surface of a semiconductor package structure 304. FIG. 3B is a vertical cross-sectional view of the semiconductor package structure 304 having the solid thermal interface material 124 adhered to a top surface of the semiconductor package structure 304. In this regard, the apparatus 302 may be a tape dispensing apparatus that may be configured to apply an adhesive tape 306 to a surface of the solid thermal interface material 124. For example, as shown in FIG. 3A, the tape dispensing apparatus may apply the adhesive tape 306 to a first surface (e.g. the upper surface in FIG. 3A) of the solid thermal interface material 124. The adhesive tape 306 may be a double-sided adhesive tape that may be used to adhere the solid thermal interface material 124 to a surface of the semiconductor package structure 304, as shown in FIG. 3B. In this regard, after the adhesive tape 306 is applied to the first surface, the solid thermal interface material 124 may then be turned over and placed in contact with a top surface of the semiconductor package structure 304 such that the solid thermal interface material 124 may be adhered to the semiconductor package structure 304 as shown in FIG. 3B. The apparatus 302 may also be used to apply an adhesive tape 306 to a second surface (not shown) of the solid thermal interface material 124 (i.e., the upper surface in FIG. 3B) so that the solid thermal interface material 124 may then be adhered to an internal surface of a package lid 120 by bringing the internal surface of the package lid 120 in contact with a surface of the adhesive tape 306.

FIG. 3C is a vertical cross-sectional view of the semiconductor package structure 304 having the solid thermal interface material 124 adhered to a top surface of the semiconductor package structure 304 and a package lid 120 covering the semiconductor package structure 304. The solid thermal interface material 124 may have various defects that may be formed within a bulk portion of the solid thermal interface material 124 and at interfaces between the solid thermal interface material 124 and the package lid 120 and between the solid thermal interface material 124 and the semiconductor die 102. The defects may give rise to a bulk thermal resistance RB 402 and a contact (i.e., interface) thermal resistance RC 404, as described in greater detail with reference to FIG. 4, below.

Thermal resistance is a measure of how difficult it is for heat to flow through a material. Thermal resistance is usually expressed in units of degrees Celsius per watt (° C./W). Bulk thermal resistance refers to the resistance to heat flow through a body of material, such as a solid block of metal or the solid thermal interface material 124. Bulk thermal resistance may be determined by the properties of the material, such as its conductivity, density, and specific heat capacity, as well as its size and shape. Contact thermal resistance refers to the resistance to heat flow between two surfaces that are in direct contact with each other. Contact thermal resistance may be determined by the properties of the materials at the interface, as well as the quality of the contact between the surfaces. Factors that can affect contact thermal resistance include the roughness of the surfaces, the presence of any contaminants or defects, and the pressure applied to the surfaces. In general, the thermal resistance of a system is determined by the sum of the bulk and contact thermal resistances of the various materials and interfaces within the system.

Figure 4:
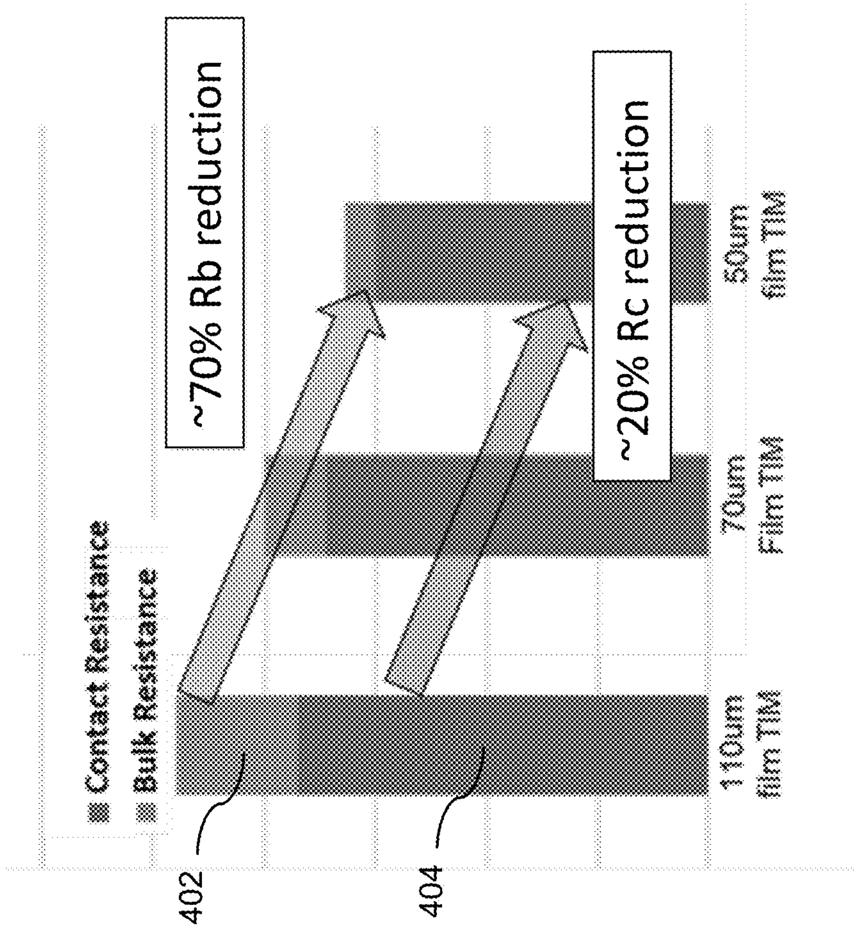
FIG. 4 is a plot of thickness variation of thermal resistance of three solid thermal interface materials.

FIG. 4 is a plot of thickness variation of thermal resistance of three solid thermal interface materials 124. As shown, FIG. 4 illustrates a bulk thermal resistance RB 402 and a contact thermal resistance RC 404 for three solid thermal interface materials 124 having thicknesses of 110 microns, 70 microns, and 50 microns, respectively. Both the bulk thermal resistance RB 402 and the contact thermal resistance RC 404 decrease with thickness as expected based on accepted theory of thermal resistance. However, the bulk thermal resistance RB 402 may be seen to decrease more rapidly with thickness than the corresponding contact thermal resistance RC 404. In this regard, the slower decrease in the contact thermal resistance RC 404 may be due to the presence of surface defects, which may be related to the porosity and the of the solid thermal interface material 124. In various disclosed embodiments, the thermal properties of the solid thermal interface material 124 may be improved by varying the composition of the solid thermal interface material 124, as described in greater detail with reference to FIGS. 5 to 6D.

Figure 5:
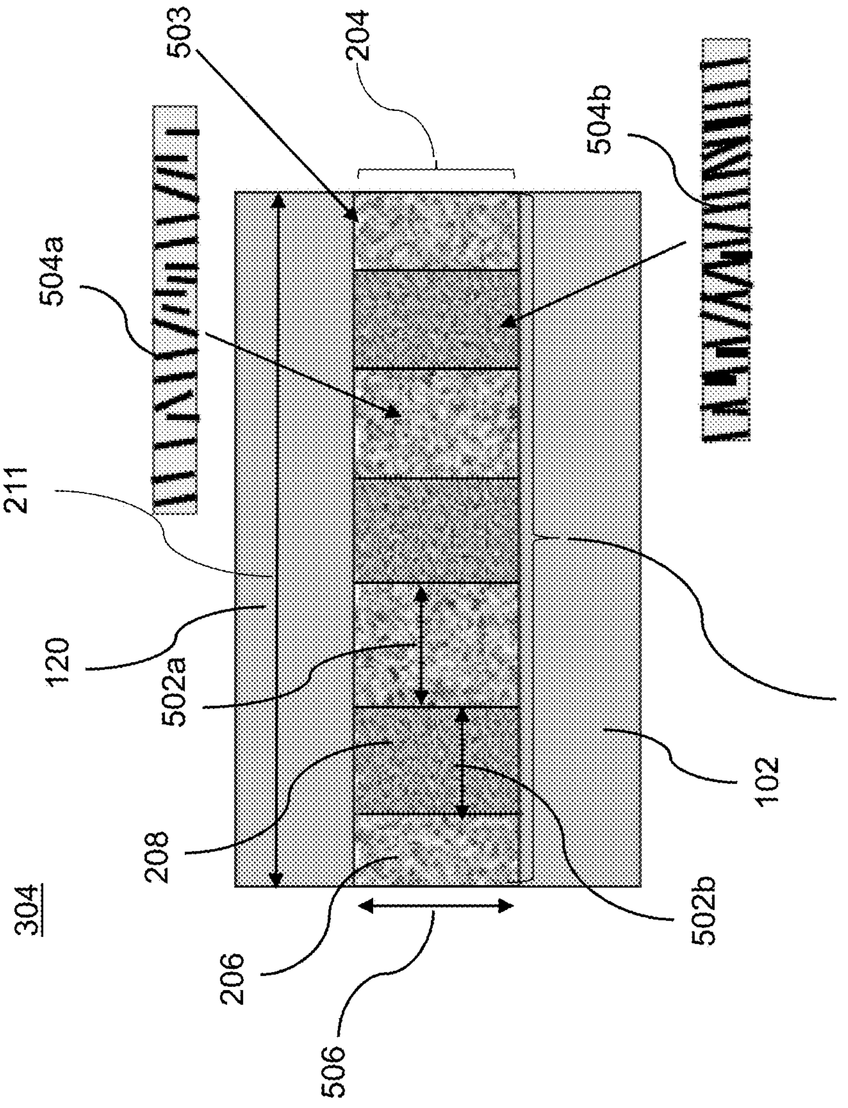
FIG. 5 is a vertical cross-section of a portion of a semiconductor package structure including a thermal interface material having a multi-layer structure including a first component and a second component, according to various embodiments.

FIG. 5 is a vertical cross-section of a portion of a semiconductor package structure 304 including a thermal interface material 124 having a multi-layer structure 204 including a first component 206 and a second component 208, according to various embodiments. The first component 206 may include a thermally conductive material dispersed within a polymer matrix. For example, the first component 206 may include graphite having a weight fraction of between 40 wt % and 60 wt % graphite and the polymer matrix may include several different polymer materials. For example, the polymer matrix may include 5 wt % to 15 wt % hydrogenated hydrocarbon resin, 10 wt % to 30 wt % polybutene, 5 wt % to 15 wt % polyisobutylene, and 5 wt % to 20 wt % acrylic acid ester copolymer. Various embodiments may include additional chemical additives to control various properties such as viscosity, etc.

As shown in FIG. 5, the first component 206 may have a certain surface roughness that may allow for the formation of voids 503 at interfaces between the first component 206 and surfaces of the package lid 120 and the semiconductor die 102. For example, in various embodiments, the first component 206 may have a first surface roughness that is between 40 microns and 50 microns. Such roughness may contribute to the contact thermal resistance RC 404 shown in FIG. 4. In this regard, a rough surface may include voids 503 that may act as poor thermal conductors. In general, the best thermal conductivity (i.e., lowest thermal resistance) between two materials occurs when smooth surfaces of the two materials are in contact because the thermal conductivity is proportional to a contact surface area between the two materials. The presence of surface roughness (i.e., including voids) implies a lower contact area between the two materials leading to a lower thermal conductivity (i.e., higher thermal contact resistance).

As described above, however, the polymer matrix of the first component 206 may have other desirable properties. For example, the first component 206 may have adhesive properties that may aid in the adhesion of the first component 206 to surfaces of the package lid 120 and the semiconductor die 102. In this regard, in some embodiments, the first component 206 may be sufficiently adhesive that it may adhere to the package lid 120 and the semiconductor die 102 without the need for the adhesive tape 306 described above. Therefore, as mentioned above, it may be advantageous to form a thermal interface material 124 (e.g., see FIG. 5) having a multi-layer structure 204 including a first component 206 (having desirable adhesive properties) and a second component 208 (having desirable heat transfer properties), as described in greater detail with reference to FIG. 5, below.

The portion of the thermal interface material 124 shown in FIG. 5 may have a width 211 that is a fraction of the width 210 shown in FIG. 2. The thermal interface material 124 may have a planar shape extending along a width direction (e.g., horizontally in FIG. 5), a length direction (e.g., into the plane of FIG. 5), and a thickness direction (e.g., vertically in FIG. 5). As shown, the multi-layer structure 204 may include alternating layers of a first component 206 and a second component 208 stacked along the width direction such that interfaces between adjacent layers are perpendicular to the width direction and extend in the length direction and the thickness direction. Each layer of the first component 206 may have a first width 502*a* and each layer of the second component 208 further may have a second width 502*b*. The first component 206 and the second component 208 may also share a common thickness 506. According to an embodiment, each of the first width 502*a*, the second width 502*b*, and the common thickness 506 may have values within a range from approximately 10 microns and 200 microns. The total width 210 of the thermal interface material 124 (e.g., see FIG. 2) may be a multiple of the first width 502*a* and the second width 502*b*.

According to an embodiment, each of the first component 206 and the second component 208 may include a thermally conductive material including one or more of graphite, graphene, carbon nanotubes, a metal, and a phase change material. For example, the first component 206 may include graphite or carbon fibers 504*a* having a first density and the second component 208 may have graphite or carbon fibers 504*b* having a second density. According to an example embodiment, the first component 206 may include a first weight fraction graphite that is in a range from approximately 40 wt % to approximately 60 wt % and the second component 208 may include a second weight fraction of graphite that is in a range from approximately 60 wt % to approximately 70 wt %. In other embodiments, one or both of the first component 206 and the second component 208 may include a non-fibrous carbon component such as pyrolytic graphite (i.e., high density sintered graphite).

Each of the first component 206 and the second component 208 may include a polymer matrix including one or more of a hydrogenated hydrocarbon resin, polybutene, polyisobutylene, an acrylic acid ester copolymer, etc. Various other polymers may be used in the contemplated scope of this disclosure. As described above, various properties of the thermal interface material 124 may be controlled by variation of the composition and widths of the first component 206 and the second component. For example, by varying the composition, the first component 206 may have a first thermal conductivity that is between 20 W/cm·K and 30 W/cm·K and the second component may have a second thermal conductivity that is between 30 W/cm·K and 40 W/cm·K. Mechanical properties, such as surface roughness may also be controlled by varying the composition of the first component 206 and the second component 208. For example, according to an embodiment, the first component 206 may have a first surface roughness that is between 40 microns and 50 microns and the second component 208 may have a second surface roughness that is between 3 microns and 4 microns. Also, as mentioned above, the adhesive properties of the first component 206 and the second component 208 may depend on the composition of the polymer matrix as well as on the density of the thermally conducting material that is dispersed therein. The lower surface roughness of the second component 208 may improve the thermal conductive properties of the thermal interface material 124 while the relatively greater adhesive properties of the first component 206 may improve the ability of the thermal interface material 124 to adhere to surfaces of the semiconductor dies (102, 104) and the package lid 120.

Figures 6A, 6B, 6C, 6D:
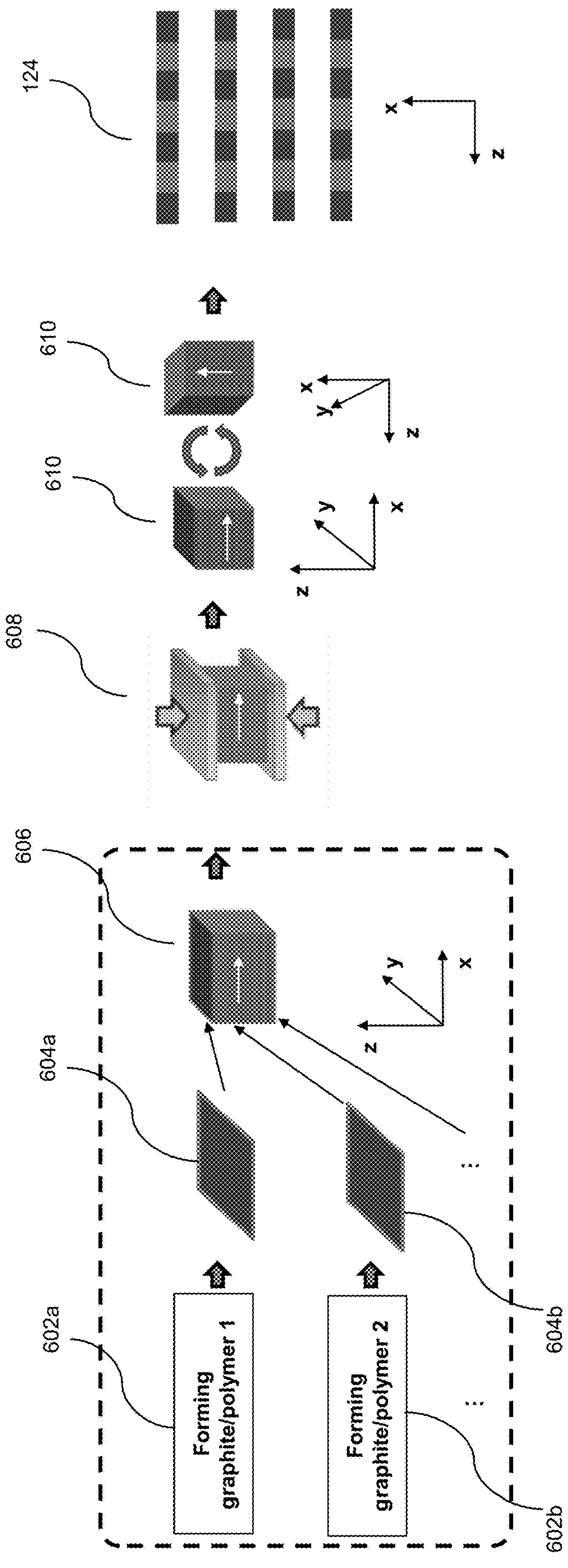
FIG. 6A is a three-dimensional perspective view of materials that may be assembled to form a thermal interface material, according to various embodiments.
FIG. 6B is a three-dimensional perspective illustration of a sheet pressing operation that may be used to form a thermal interface material, according to various embodiments.
FIG. 6C is a three-dimensional perspective view of a rotation operation that may be performed to change an orientation of a first component and a second component of a thermal interface material, according to various embodiments.
FIG. 6D is an edge view of a plurality of thermal interface materials having a first component and a second component, according to various embodiments.

FIGS. 6A to 6D illustrate various configurations of materials that may be processed to form the thermal interface material 124 of FIG. 5. In this regard, FIG. 6A is a three-dimensional perspective view of materials that may be assembled to form the thermal interface material 124, and FIG. 6B is a three-dimensional perspective view of a sheet pressing operation that may be used to form the thermal interface material 124, according to various embodiments. FIG. 6C is a three-dimensional perspective view of a rotation operation that may be performed to change an orientation of a first component and a second component of a thermal interface material, and FIG. 6D is an edge view of a plurality of thermal interface materials having a first component and a second component, according to various embodiments. As shown in FIG. 6A, a first process 602*a* may be performed to generate a plurality of first sheets 604*a* of the first component 206 and a second process 602*b* may be performed to generate a plurality of second sheets 604*b* of the second component 208. The sheets (604*a*, 604*b*) may then be formed into a stack 606 of the first sheets 604*a* and the second sheets 604*b*.

As shown in FIG. 6A, the stack 606 may include alternating layers of a first component 206 (i.e., first sheets 604*a*) and a second component 208 (i.e., second sheets 604*b*) stacked along a first direction (e.g., along the z direction in FIG. 6A) such that interfaces between adjacent alternating layers are perpendicular to the first direction (i.e., the z direction) and extend along a second direction (i.e., the x direction; see arrow) and a third direction (i.e., the y direction). As shown in FIG. 6B, for example, a sheet pressing operation 608 may then be performed to compress the stack 606 of alternating layers so that adjacent layers adhere to one another to form a bulk thermal interface material 610. As shown in FIG. 6C, the bulk thermal interface material 610 may then be rotated by 90 degrees about the third direction (i.e., the y direction) to change an orientation of the interfaces of the bulk thermal interface material 610 (e.g., see rotated arrow).

The bulk thermal interface material 610 may then be sliced to form a plurality of thermal interface material 124 sheets, as shown in FIG. 6D. In this regard, the bulk thermal interface material 610 may be sliced along the second direction (i.e., the x direction) to form the plurality of thermal interface material 124 sheets. As shown, the resulting the plurality of thermal interface material 124 sheets may have a certain width along a width direction (i.e., along the z direction) and a certain thickness along a thickness direction (i.e., along the x direction). The plurality of thermal interface material 124 sheets may also have a certain length along the length direction (i.e., along the y direction into the plane of FIG. 6D).

A specific width and length of the plurality of thermal interface material 124 sheets may also be generated by slicing the bulk thermal interface material 610 along planes perpendicular to the first direction (i.e., z direction) and the third direction (i.e., the y direction), respectively. As such, the bulk thermal interface material 610 may be sliced along planes perpendicular to the first direction (i.e., the z direction), the second direction (i.e., the x direction), and the third direction (i.e., the y direction) to generate a planar shape extending along a width direction, a thickness direction, and a length direction, respectively, such that the width direction corresponds to the first direction (z), the length direction corresponds to the third direction (y), and the thickness direction corresponds to the second direction (x). In various embodiments, the width and length of the plurality of thermal interface material 124 sheets may be similar, such that the thermal interface material 124 sheets may be rectangular or square shaped.

Figure 7:
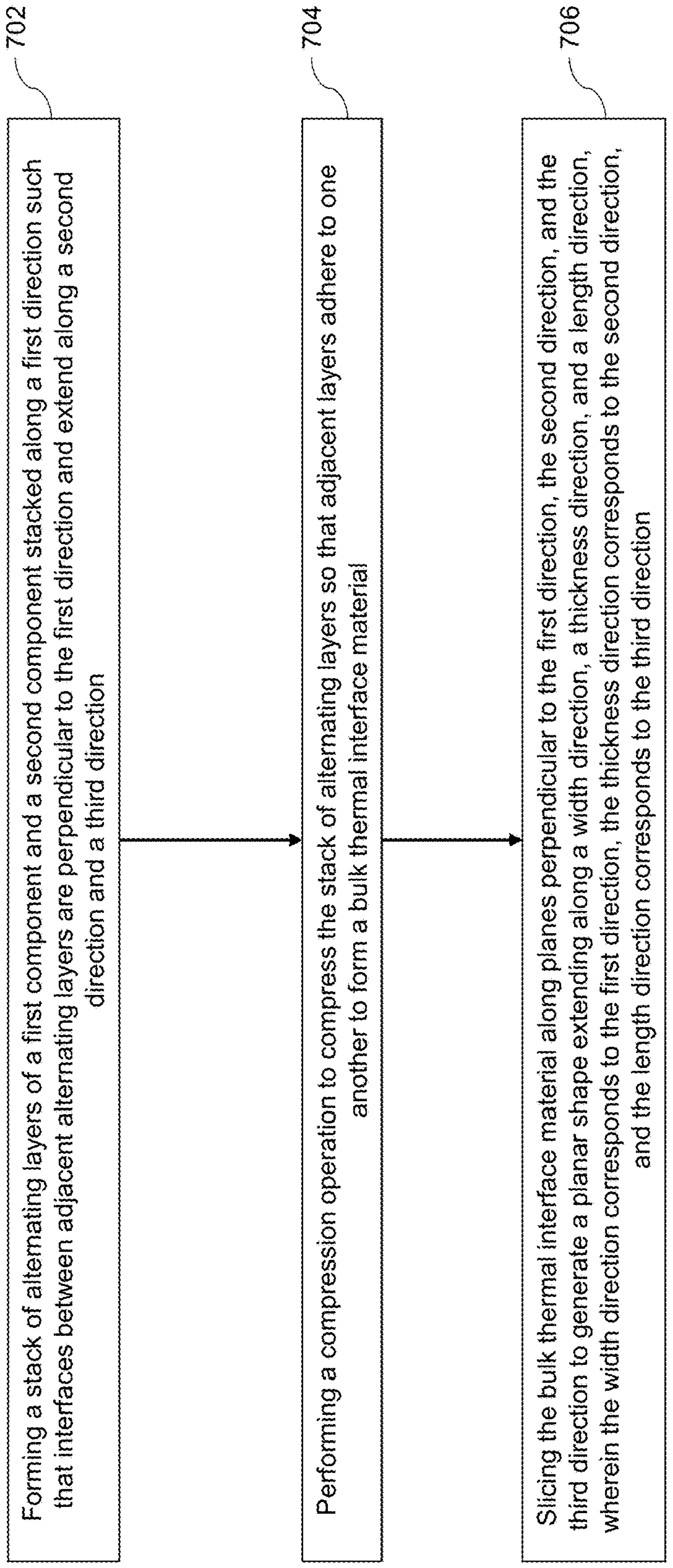
FIG. 7 is a flowchart illustrating operations of a method of manufacturing a thermal interface material, according to various embodiments.

FIG. 7 is a flowchart illustrating operations of a method 700 of manufacturing a thermal interface material 124, according to various embodiments. In operation 702, the method 700 may include forming a stack 606 of alternating layers (604*a*, 604*b*) of a first component 206 and a second component 208 stacked along a first direction (z) such that interfaces between adjacent alternating layers (604*a*, 604*b*) are perpendicular to the first direction (z) and extend along a second direction (x) and a third direction (y). According to various embodiments, the first component 206 may include a first thermal conductivity that is between 20 W/cm·K and 30 W/cm·K, and the second component 208 may include a second thermal conductivity that is between 30 W/cm·K and 40 W/cm·K. In operation 704, the method 700 may include performing a compression operation 608 to compress the stack 606 of alternating layers (604*a*, 604*b*) so that adjacent layers adhere to one another to form a bulk thermal interface material 610. In operation 706, the method 700 may include slicing the bulk thermal interface material 610 along planes perpendicular to the first direction (z), the second direction (x), and the third direction (y) to generate a planar shape extending along a width (502*a*, 502*b*) direction (z), a thickness 506 direction (x), and a length direction (y), such that the width direction corresponds to the first direction (z), the thickness 506 direction corresponds to the second direction (x), and the length direction corresponds to the third direction (y).

The method 700 may further include providing the first component 206 as a first composite material including 40 wt % to 60 wt % graphite dispersed in a first polymer matrix and providing the second component 208 as a second composite material including 60 wt % to 70 wt % graphite dispersed in a second polymer matrix. In further embodiments, the method 700 may include providing the first component 206 as a first composite material including a first surface roughness that is between 40 microns and 50 microns and providing the second component 208 as a second composite material including a second surface roughness that is between 3 microns and 4 microns.

The method 700 may further include providing the first component 206 as a first composite material including graphite dispersed in an adhesive polymer matrix such that the first component 206 has adhesive properties and attaching the thermal interface material 124 to one or both of a semiconductor die (102, 104) and a package lid 120. In this regard, the second interface material 124 may be attached to one or both of a semiconductor die (102, 104) and a package lid 120 by placing the thermal interface material 124 in contact with the one or both of the semiconductor die (102, 104) and the package lid 120 such that adhesive surfaces of the first component 206 perpendicular come in contact with and adhere to one or more surfaces of the one or both of the semiconductor die (102, 104) and the package lid 120.

Referring to all drawings and according to various embodiments of the present disclosure, a thermal interface material 124 is provided. The thermal interface material 124 may include a first component 206 including a first thermal conductivity that is between 20 W/cm·K and 30 W/cm·K, and a second component 208 having a second thermal conductivity that is between 30 W/cm·K and 40 W/cm·K. Each of the first component 206 and the second component 208 may include a thermally conductive material including one or more of graphite, graphene, carbon nanotubes, a metal, and a phase change material. For example, each of the first component 206 and the second component 208 may include graphite dispersed within a polymer matrix. The polymer matrix may include one or more of a hydrogenated hydrocarbon resin, polybutene, polyisobutylene, and an acrylic acid ester copolymer. According to some embodiments, the first component 206 may include 40 wt % to 60 wt % graphite, and the second component 208 may include 60 wt % to 70 wt % graphite.

According to various embodiments, the thermal interface material 124 further may have a planar shape (e.g., see FIGS. 5 and 6D) extending along a width (502*a*, 502*b*) direction (z), a thickness 506 direction (x), and a length direction (y), and a multi-layer structure including alternating layers (604*a*, 604*b*) of the first component 206 and the second component 208 stacked along the width direction (z) such that interfaces between adjacent layers are perpendicular to the width direction (z) and extend in the length direction (y) and the thickness 506 direction (x). Each layer (i.e., first sheet 604*a*) of the first component 206 may further include a first width 502*a* and each layer of the second component 208 further may include a second width 502*b*. The first width 502*a*, the second width 502*b*, and a thickness 506 of the planar shape may each be within a range from 10 microns and 200 microns. The first component 206 may include a first surface roughness that is between 40 microns and 50 microns, and the second component 208 include a second surface roughness that is between 3 microns and 4 microns. Further, according to various embodiments, first component 206 may include a thermally conductive material dispersed in an adhesive polymer matrix such that the first component 206 has adhesive properties.

According to a further embodiment, a thermal interface material 124 is provided. The thermal interface material 124 may have a planar shape extending along a width direction (z), a length direction (y), and a thickness 506 direction (x) and may have a multi-layer structure including alternating layers (604*a*, 604*b*) of a first component 206 and a second component 208 stacked along the width direction (z) such that interfaces between adjacent layers are perpendicular to the width direction (z) and extend in the length direction (y) and the thickness 506 direction (x). Each of the first component 206 and the second component 208 may include a thermally conductive material including one or more of graphite, graphene, carbon nanotubes, a metal, and a phase change material. In some embodiments, one or both of the first component 206 and the second component 208 may include pyrolytic graphite.

The first component 206 may include 40 wt % to 60 wt % graphite dispersed in a first polymer matrix and the second component 208 may include 60 wt % to 70 wt % graphite dispersed in a second polymer matrix. In some embodiments, one or both of the first polymer matrix and the second polymer matrix may include one or more of a hydrogenated hydrocarbon resin, polybutene, polyisobutylene, and an acrylic acid ester copolymer. Further, the first component 206 may include a first thermal conductivity that is between 20 W/cm·K and 30 W/cm·K and the second component 208 may include a second thermal conductivity that is between 30 W/cm·K and 40 W/cm·K. The first component 206 may have a first surface roughness that is between 40 microns and 50 microns and the second component 208 may have a second surface roughness that is between 3 microns and 4 microns. Further, according to various embodiments, the first component 206 may include graphite dispersed in an adhesive polymer matrix such that the first component 206 has adhesive properties.

As described above, the described embodiment thermal interface materials may provide advantages in that complementary properties of thermal conductivity and adhesive characteristics may be optimized by an appropriate chose of relative proportions and sizes of a first component and a second component. In this regard, the second component may have a higher thermal conductivity and may have lower surface roughness while the first component may have higher surface roughness but may have better adhesive properties. The lower surface roughness of the second component may improve heat transfer between semiconductor dies and a package lid while the adhesive properties of the first component may allow the thermal interface material to be adhered to one or more of the semiconductor dies and the package lid without the use of additional adhesives, in some embodiments. As such, the embodiment thermal interface material, which may have a multi-layer structure, may have advantages over thermal interface materials having only a single component.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A thermal interface material, comprising:
- a planar shape extending along a width direction, a length direction, and a thickness direction; and
- a multi-layer structure comprising alternating layers of:
  - a first component having a first density; and
  - a second component having a second density, wherein the first component and the second component are stacked along the width direction such that interfaces between adjacent layers are perpendicular to the width direction and extend in the length direction and the thickness direction, wherein each of the first component and the second component comprises a thermally conductive material comprising one or more of graphite, graphene, carbon nanotubes, a metal, and a phase change material, and wherein the first density and the second density are different.

2. The thermal interface material of claim 1, wherein one or both of the first component and the second component comprise pyrolytic graphite.

3. The thermal interface material of claim 1, wherein:
- the first component comprises 40 wt % to 60 wt % graphite dispersed in a first polymer matrix; and
- the second component comprises 60 wt % to 70 wt % graphite dispersed in a second polymer matrix.

4. The thermal interface material of claim 3, wherein one or both of the first polymer matrix and the second polymer matrix comprises one or more of a hydrogenated hydrocarbon resin, polybutene, polyisobutylene, and an acrylic acid ester copolymer.

5. The thermal interface material of claim 3, wherein:
- the first component comprises a first thermal conductivity that is between 20 W/cm·K and 30 W/cm·K; and
- the second component comprises a second thermal conductivity that is between 30 W/cm·K and 40 W/cm·K.

6. The thermal interface material of claim 1, wherein the first component comprises a first surface roughness that is between 40 microns and 50 microns, and wherein the second component comprise a second surface roughness that is between 3 microns and 4 microns.

7. The thermal interface material of claim 1, wherein the first component comprises graphite dispersed in an adhesive polymer matrix such that the first component has adhesive properties.

8. A semiconductor package, comprising:
- a package substrate;

at least one semiconductor die mounted on the package substrate;

a package lid overlying the at least one semiconductor die and attached to the package substrate; and a thermal interface material located between a top surface of the at least one semiconductor die and an interior surface of the package lid, wherein the thermal interface material comprises:

a first component comprising graphite dispersed in an adhesive polymer matrix such that the first component adheres to at least one of the top surface of the at least one semiconductor die or the interior surface of the package lid, wherein the first component has a first surface roughness; and a second component comprising a thermally conductive material dispersed in a polymer matrix, wherein the thermal interface material has a multi-layer structure comprising alternating layers of the first component and the second component stacked along a width direction such that interfaces between adjacent layers are perpendicular to the width direction and extend in a length direction and the thickness direction, wherein the second component has a second surface roughness lower than the first surface roughness.

9. The semiconductor package structure of claim 8, wherein:

the first component comprises a first thermal conductivity that is between 20 W/cm·K and 30 W/cm·K; and the second component comprises a second thermal conductivity that is between 30 W/cm·K and 40 W/cm·K.

10. The semiconductor package structure of claim 8, wherein:

the first component comprises 40 wt % to 60 wt % graphite dispersed in a first polymer matrix; and the second component comprises 60 wt % to 70 wt % graphite dispersed in a second polymer matrix.

11. The semiconductor package structure of claim 10, wherein at least one of the first polymer matrix and the second polymer matrix comprises one or more of a hydrogenated hydrocarbon resin, polybutene, polyisobutylene, and an acrylic acid ester copolymer.

12. The semiconductor package structure of claim 8, wherein:

the first surface roughness is between 40 microns and 50 microns; and the second surface roughness is between 3 microns and 4 microns.

13. The semiconductor package structure of claim 8, wherein each of the first component and the second component comprises a thermally conductive material comprising one or more of graphite, graphene, carbon nanotubes, a metal, and a phase change material.

14. The semiconductor package structure of claim 8, wherein the plurality of semiconductor dies comprises:

a plurality of first semiconductor dies located in a central region of the semiconductor package structure, each first semiconductor die configured as one of a three-dimensional integrated circuit, a system-on-chip device, or a system-on-integrated-circuit device; and a plurality of second semiconductor dies located on a periphery around the first semiconductor dies, each second semiconductor die configured as a semiconductor memory device.

15. The semiconductor package structure of claim 14, wherein the thermal interface material has a width that vertically overlap with a location of the plurality of first semiconductor dies and the plurality of second semiconductor dies.

16. A thermal interface material, comprising:

a multi-layer structure comprising alternating layers of a first component and a second component, wherein the multi-layer structure includes a planar shape extending along a width direction, a length direction, and a thickness direction;

wherein the first component and the second component are stacked along the width direction such that interfaces between adjacent layers are perpendicular to the width direction and extend in the length direction and the thickness direction, wherein the first component comprises a thermally conductive material dispersed in a first polymer matrix, the first polymer matrix being an adhesive polymer matrix such that the first component has adhesive properties;

wherein the second component comprises a thermally conductive material dispersed in a second polymer matrix; and wherein the first component has a first thermal conductivity, and the second component has a second thermal conductivity greater than the first thermal conductivity.

17. The thermal interface material of claim 16, wherein the thermal interface material disposed between an upper surface of at least one of a plurality of semiconductor dies and an interior surface of a package lid.

18. The thermal interface material of claim 17, further comprising a second thermal interface material disposed between an upper surface of the package lid and a bottom surface of a heat sink.

19. The thermal interface material of claim 17, wherein:

a first underfill material portion is provided in spaces laterally separating adjacent semiconductor dies of the plurality of semiconductor dies; and a second underfill material portion is provided in spaces surrounding a plurality of second metal bumps and between a bottom surface of an interposer and an upper surface of a package substrate.

20. The thermal interface material of claim 17, wherein each layer of the first component further comprises a first width and each layer of the second component further comprises a second width, and wherein the first width, the second width, and a thickness of the planar shape are each within a range from 10 microns and 200 microns.

* * * * *